(12) United States Patent
Nam et al.

(10) Patent No.: US 7,589,540 B2
(45) Date of Patent: Sep. 15, 2009

(54) CURRENT-MODE SEMICONDUCTOR INTEGRATED CIRCUIT DEVICE OPERATING IN VOLTAGE MODE DURING TEST MODE

(75) Inventors: Jan-Jin Nam, Yongin-si (KR); Yong-Weon Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 175 days.

(21) Appl. No.: 11/700,046

(22) Filed: Jan. 31, 2007

(65) Prior Publication Data
US 2007/0176610 A1    Aug. 2, 2007

(30) Foreign Application Priority Data
Jan. 31, 2006    (KR) .................. 10-2006-0009441

(51) Int. Cl.
*G01R 27/08* (2006.01)
*H04L 27/00* (2006.01)
(52) U.S. Cl. .................. 324/713; 375/295; 375/316
(58) Field of Classification Search .......... 324/713, 324/691, 649, 600, 765, 537, 522, 523, 527, 324/763, 607, 120, 76.11; 375/295, 316, 375/224; 257/299; 307/151; 327/100, 103; 702/126

See application file for complete search history.

(56) References Cited

U.S. PATENT DOCUMENTS 4,183,460 A * 1/1980 Yuen et al. ................ 714/732
5,617,035 A    4/1997 Swapp
5,844,913 A   12/1998 Hassoun et al.
5,956,370 A *  9/1999 Ducaroir et al. ............ 375/221
6,255,839 B1 * 7/2001 Hashimoto ................ 324/765
6,801,577 B2 * 10/2004 Ranganathan et al. ....... 375/257
2006/0199556 A1 * 9/2006 Chang et al. ............. 455/195.1

FOREIGN PATENT DOCUMENTS

| JP | 2004-020256 | 1/2004 |
|---|---|---|
| KR | 10-1998-026774 | 7/1998 |
| KR | 10-1998-034681 | 8/1998 |
| WO | WO 99/10752 | 3/1999 |

* cited by examiner

*Primary Examiner*—Hoai-An D Nguyen
(74) *Attorney, Agent, or Firm*—Harness, Dickey & Pierce, P.L.C.

(57) ABSTRACT

Provided is a current-mode semiconductor integrated circuit device that operates in a voltage mode during a test mode. The current-mode semiconductor integrated circuit device includes a first transmitting converter, a first receiving converter, a second transmitting converter, and a second receiving converter. During the test mode, one of a first signal path and a second signal path is selected according to the location of the chip. In the first signal path, the first transmitting converter, the first receiving converter, and the second transmitting converter operate. In the second signal path, the second transmitting converter, the second receiving converter, and the first transmitting converter operate. Each of the first and second transmitting converters receives a test voltage signal and converts it into a current signal. Each of the first and second receiving converters generates a reference voltage signal, compares it with the test voltage signal, and outputs the comparing result.

12 Claims, 4 Drawing Sheets

CURRENT-MODE SEMICONDUCTOR INTEGRATED CIRCUIT DEVICE OPERATING IN VOLTAGE MODE DURING TEST MODE

PRIORITY STATEMENT

This application claims the priority of Korean Patent Application No. 10-2006-0009441, filed on Jan. 31, 2006, in the Korean Intellectual Property Office, the disclosure of which is incorporated herein in its entirety by reference.

BACKGROUND

1. Field

Example embodiments relate to a current-mode semiconductor integrated circuit, for example, to a semiconductor integrated circuit device that operates in a current mode during a general operation mode but may operate in a voltage mode during a test mode.

2. Description of the Related Art

A semiconductor device may exchange data with another semiconductor device by using a voltage signal or a current signal. A semiconductor device transmitting and receiving data via a voltage signal may be referred to as a voltage-mode semiconductor device, and a semiconductor device transmitting and receiving data via a current signal may be referred to as a current-mode semiconductor device. To operate a semiconductor device at higher speeds, data may be transmitted via a current signal, not a voltage signal.

An EDS tester and other types of testers (not shown) generally supply a voltage signal to a semiconductor device, which may be referred to as a device under test (DUT), in order to test the semiconductor device. Semiconductor devices are tested by a voltage-mode tester because a voltage-mode tester may be cheaper than a current-mode tester and may reduce or minimize measurement errors. However, some semiconductor chips are designed to operate in a current mode so that they may be driven or operate at higher speeds.

In order to test a semiconductor device operating in a current mode, a measuring device that supplies a current signal to the semiconductor device and measures data output from the semiconductor device in the form of a current signal is needed. However, in general, signal transmission in most common chips is performed in the voltage mode, and signal measurement is also performed in the voltage mode. For this reason, current-mode testers are difficult to apply in most cases, and an additional module capable of measuring current must be provided.

The additional module, however, may increase manufacturing costs, and may require a device that provides an interface between the module and a DUT. Also, the additional module may require time to perform a verification process, thereby increasing the total test time.

Also, a voltage-mode measuring device may be connected to the DUT in parallel to supply a voltage signal to or receive a voltage signal from the DUT, whereas a current-mode measuring device is connected to the DUT in series. Therefore, use of the current-mode measuring device may change the input/output loading on the DUT, thereby degrading test performance.

SUMMARY

Example embodiments provide a current-mode semiconductor device that has an interface circuit capable of performing voltage-to-current conversion, which may operate in a voltage mode during a test so that the semiconductor device can be tested with an existing voltage-mode tester.

According to example embodiments, there is provided a semiconductor integrated circuit device which operates in a current mode but can operate in a voltage mode during a test mode, the device including a first transmitting converter that receives a first test voltage and converts the first test voltage into a first test current signal, a first receiving converter that receives the first test current signal and a reference current signal and generates a first output voltage signal based on the first test current signal and the reference current signal, and a first output unit that outputs the first output voltage external to semiconductor integrated circuit device.

According to example embodiments, there is provided a semiconductor integrated circuit device which operates in a voltage mode during a test mode and operates in a current mode during a non-test mode, the device including a first transmitting converter that receives a first test voltage signal from a voltage-mode tester and converts the first test voltage signal into a first test current signal during the test mode; and a first receiving converter that converts the first test current signal into a first voltage signal during the test mode, and receives a data current signal via a channel and converts it into the first voltage signal during the non-test mode.

BRIEF DESCRIPTION OF THE DRAWINGS

The above and other aspects and advantages of example embodiments will become more apparent by describing same in detail with reference to the attached drawings in which.

DETAILED DESCRIPTION OF EXAMPLE EMBODIMENTS

Figure 1:
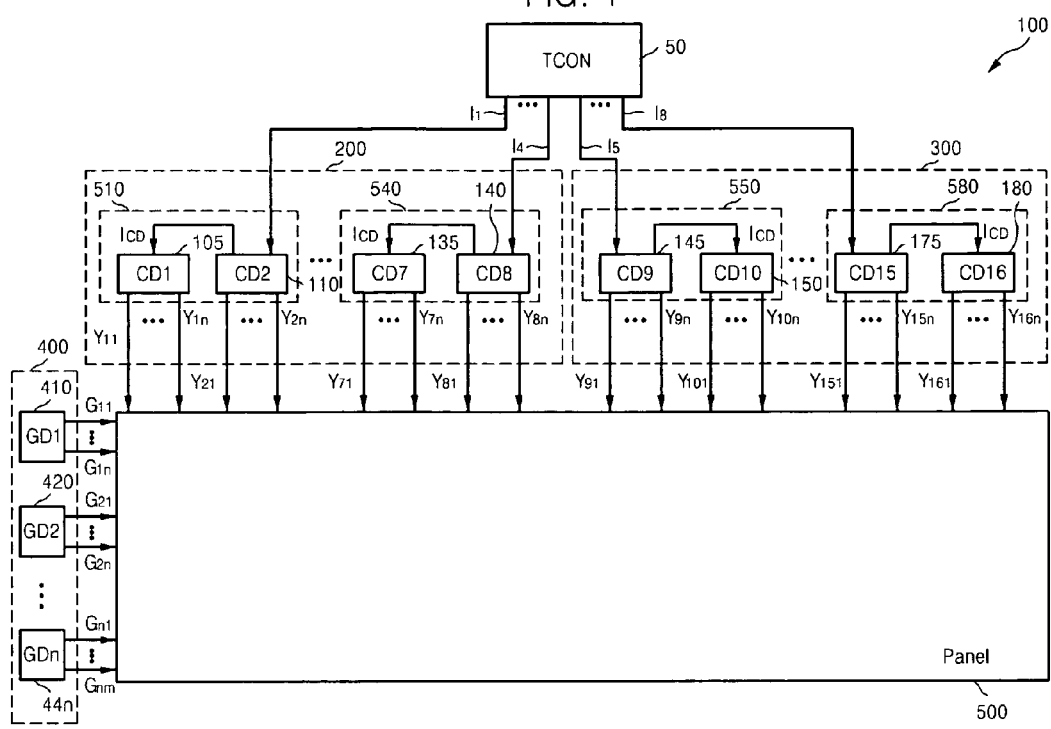
FIG. 1 is a circuit diagram of column drivers of a liquid crystal display (LCD) according to example embodiments.

Example embodiments will be more clearly understood from the detailed description taken in conjunction with the accompanying drawings.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the appended claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments, various embodiments will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments have been disclosed for illustrative purposes, those skilled in the art will appreciate that various modifications, additions and substitutions are possible, without departing from the scope and spirit of example embodiments as disclosed in the accompanying claims.

Hereinafter, example embodiments will be described in detail with reference to the accompanying drawings. Like reference numerals denote like elements throughout the drawings.

FIG. 1 is a circuit diagram of a plurality of column drivers 105, . . . , 180 of a liquid crystal display (LCD) 100 according to example embodiments. Referring to FIG. 1, the LCD 100 may include a timing controller 50, column drivers 105, 110, . . . , 180, and/or a gate driver unit 400.

For operation of the LCD 100 at higher speeds, the timing controller 50 and the column drivers 105, 110, . . . , 180 may operate in a current mode. That is, the timing controller 50 may transmit a control signal and source data (image data) to the column drivers 105, 110, . . . , 180 via a current signal.

Accordingly, the column drivers 105, 110, . . . , 180 may operate in the current mode during a general operation mode, but may operate in a voltage mode during a test. Thus, each of the column drivers 105, 110, . . . , 180 may include an interface circuit (not shown) that may transmit and receive a current signal, receive a voltage signal, transform it into an internal current signal, and transform a current signal into a voltage signal and output the voltage signal.

As illustrated in FIG. 1, the column drivers 105, 110, . . . , 180 may be divided into a first group 200 and a second group 300 with respect to the timing controller 50. This is because a signal path via which signals are supplied to or output from the column drivers 105, . . . , 140 belonging to the first group 200 adjacent to one side of the timing controller 50 may be different from a signal path via which signals are supplied to or output from the column drivers 145, . . . , 180 belonging to the second group 300 adjacent to the other side of the timing controller 50.

Also, the column drivers 105, 110, . . . , 180 may be divided into groups 510, 540, 550, and 580, each group including two column drivers. The column drivers 110, 140, 145, 175 that belong to the groups 510, 540, 550, and 580, respectively, may be connected to the timing controller 50 in point-to-point fashion. The other column drivers 105, 135, 150, and 180 may be connected to the column drivers 110, 140, 145, and 175 in cascade fashion. That is, the other column drivers 105, 135, 150, and 180 receive data and a control signal, which is transmitted from the timing controller 50, from the corresponding column drivers 110, 140, 145, and 175 connected to the timing controller 50 in point-to-point fashion, respectively. Thus, the interface circuit of each of the column drivers 105, 110, . . . , 180 may include a circuit that receives a signal from the timing controller 50 and a circuit that transmits a signal to the corresponding column driver. The internal construction and operation of the column drivers 105, 110, . . . , 180 will later be described with reference to FIG. 2.

Figure 2:
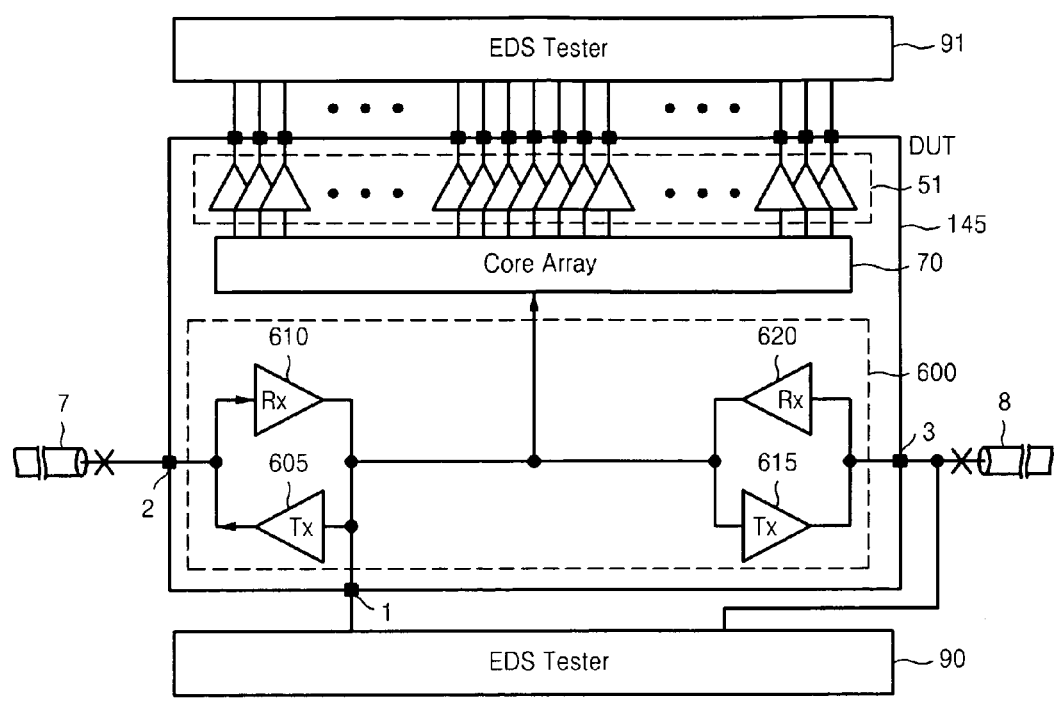
FIG. 2 is a circuit diagram illustrating a connection of a column driver, illustrated in FIG. 1, which is a device under test (DUT), to a voltage-mode tester, according to example embodiments.

FIG. 2 is a circuit diagram illustrating a connection of the column driver 145 of FIG. 1, which is a DUT, to an EDS tester 90 which is a voltage-mode tester, according to example embodiments. The column driver (DUT) 145 may include an interface circuit 600, a core array 70, an output buffer 51, and/or first through third pins 1 through 3.

The interface circuit 600 may include a first transmitting converter 605, a first receiving converter 610, a second receiving converter 620, and/or a second transmitting converter 615.

Figure 3:
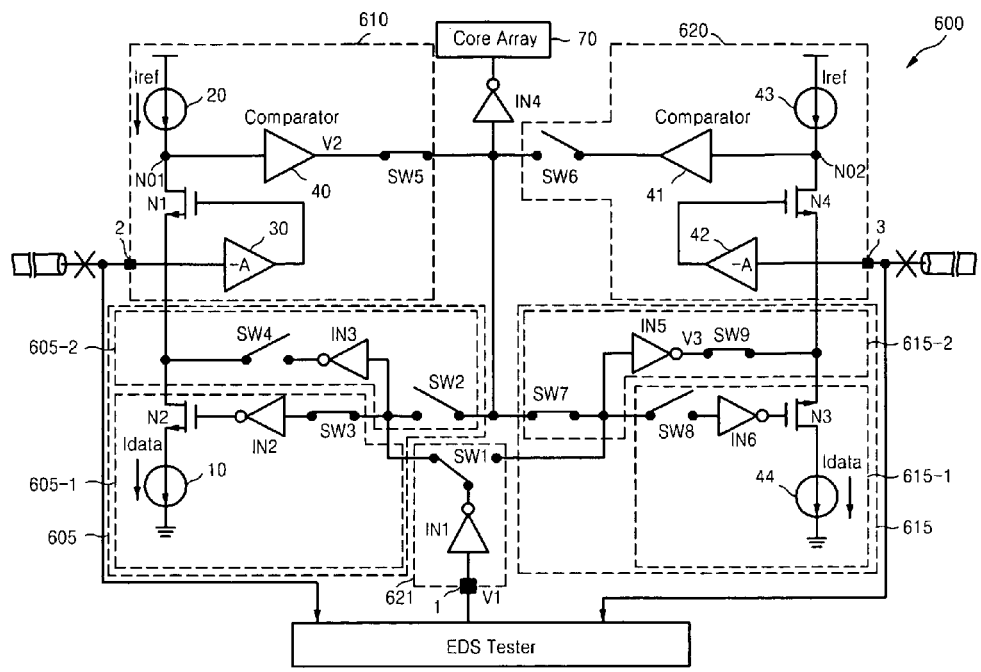
FIG. 3 is a detailed circuit diagram of an interface circuit illustrated in FIG. 2 according to example embodiments.

The first transmitting converter 605 may selectively perform the function of a first voltage-to-current converter 605-1 or the function of a second output unit 605-2 illustrated in FIG. 3 according to a signal path via which a signal is supplied to or output from the column driver 145. The signal path may vary according to the location of the column driver (DUT) 145. As illustrated in FIG. 1, the signal path of the column drivers 105, . . . , 140 of the first group 200 may be different from that of the column drivers 145, . . . , 180 of the second group 300 with respect to the timing controller 50. To support the two different signal paths, the interface circuit 600 of the column driver (DUT) 145 may further include a circuit for a first signal path including the first receiving converter 610 and the second transmitting converter 615, and a circuit for a second signal path including the second receiving converter 620 and the first transmitting converter 605.

When the first signal path is selected in a general operation mode, not a test mode, a current signal received via a channel 7 and the second pin 2 may be converted into a voltage signal by the first receiving converter 610 and supplied to the core array 70. Otherwise, the voltage signal may be converted into a current signal again by the second transmitting converter 615 and transmitted to another column driver, e.g., the column driver 150 of FIG. 1, via the third pin 3 and a channel 8.

When the second signal path is selected in the general operation mode, not the test mode, a current signal received via the channel 8 and the third pin 3 is converted into a voltage signal by the second receiving converter 620 and supplied to the core array 70. Otherwise, the voltage signal may be converted into a current signal by the first transmitting converter 605 and transmitted to another column driver via the second pin 2 and the channel 7.

Therefore, it is possible to select a path of a test signal even during a test of the column driver (DUT) 145.

When the first signal path is selected in the test mode, a test voltage signal may be input via the first pin 1 connected to the tester 90. The first pin 1 may be additionally provided for the test. The test voltage signal may be converted into a current signal by the first transmitting converter 605, converted into a voltage signal by the first receiving converter 610, and supplied to the core array 70 (or pass through the second transmitting converter 615 and output via the third pin 3). The voltage signal output via the third pin 3 may be input to the EDS tester 90, and the EDS tester 90 may compare the test voltage signal input to the DUT 145 via the first pin 1 with the voltage signal output from the DUT 145 via the third pin 3 to obtain the result of the test.

The first signal path may be selected when testing the column drivers 145, . . . , 180 belonging to the second group 300 of FIG. 1.

When the second signal path is selected in the test mode, a test voltage signal received via the first pin 1 may be supplied to the second transmitting converter 615, converted into a current signal by the second transmitting converter 615, converted into a voltage signal by the second receiving converter 620, and supplied to the core array 70 (or pass through the first transmitting converter 605 and output via the second pin 2). The voltage signal output via the second pin 2 may be supplied to the EDS tester 90, and the EDS tester 90 may compare the test voltage signal input to the DUT 145 via the first pin 1 with the voltage signal output from the DUT 145 via the second pin 2 to obtain the result of the test. A switch (not shown) may be provided to selectively supply the test voltage signal received via the first pin 1 to one of the first and second transmitting converters 605 and 615, depending on whether the first signal path or the second signal path is selected.

The second signal path may be selected when testing the column drivers 105, . . . , 140 of the first group 200.

Alternatively, the EDS tester 90 may obtain the result of the test by receiving a signal from the core array 70 and the output buffer 51.

Although not specifically shown in FIG. 2, the core array 70 may include a shifter register, a latch, and/or a digital-to-analog converter to drive channels Y91, . . . , Y9n. The construction and operation of the core array 70 may be the same as those of a core array of a general column driver, and a detailed description thereof will be omitted.

FIG. 3 is a detailed internal circuit diagram of the interface circuit 600 illustrated in FIG. 2 according to example embodiments. Referring to FIG. 3, the interface circuit 600 may include a selector 621, a first transmitting converter 605, a first receiving converter 610, a second receiving converter 620, and/or a second transmitting converter 615.

The selector 621 may include a first inverter IN1 and a first switch SW1.

The first transmitting converter 605 may be divided into a first voltage-to-current converter 605-1 and a first output unit 605-2. The first voltage-to-current converter 605-1 may include a third switch SW3, a second inverter IN2, a second NMOS transistor N2, and/or a first current source 10. The first output unit 605-2 may include a second switch SW2, a fourth switch SW4, and/or a third inverter IN3.

The first receiving converter 610 may include a first negative feedback amplifier 30, a first node NO1, a first NMOS transistor N1, a second current source 20, a first comparator 40, and/or a fifth switch SW5.

The second transmitting converter 615 may be divided into a second voltage-to-current converter 615-1 and a second output unit 615-2. The second voltage-to-current converter 615-1 may include an eighth switch SW8, a sixth inverter IN6, a third NMOS transistor N3, and/or a fourth current source 44. The second output unit 615-2 may include a seventh switch SW7, a fifth inverter IN5, and/or a ninth switch SW9.

The second receiving converter 620 may include a sixth switch SW6, a second comparator 41, a third current source 43, a fourth NMOS transistor N4, a second node NO2, and/or a second negative feedback amplifier 42.

The first switch SW1 of the selector 621 may select one of the first and second signal paths. The first inverter IN1 may be located between the first pin 1 and the first switch SW1 and may buffer a first test voltage V1.

In a test of the first signal path, a circuit that includes the first voltage-to-current converter 605-1 of the first transmitting converter 605, the first receiving converter 610, and/or the second output unit 615-2 of the second transmitting converter 615 may be tested. Thus, in this case, the first switch SW1 of the selector 621 may be connected to the first voltage-to-current converter 605-1. During the test of the first signal path, the second, fourth, sixth, and/or eight switches SW2, SW4, SW6, and/or SW8 may be kept open to prevent connection of a circuit in the second signal path.

For example, during the test of the first signal path, the third switch SW3, the second inverter IN2, the second NMOS transistor N2, and the first current source 10 of the first transmitting converter 605 may operate to act as the voltage-to-current converter 605-1. The second NMOS transistor N2 may convert the first test voltage V1 into a first current signal Idata. However, during the test of the second signal path, only the second switch SW2, the fourth switch SW4, and the third inverter IN3 may operate to act as the first output unit 605-2 that outputs a voltage signal received from the second receiving converter 620 externally.

During the test of the first signal path, the first receiving converter 610 may convert a voltage signal, induced at the first node NO1 by the difference between the first current signal Idata and the reference current signal Iref, into a CMOS-level voltage signal V2 and may output the second voltage signal V2

During the test of the first signal path, only the seventh switch SW7, the fifth inverter IN5, and the ninth switch SW9 of the second transmitting converter 615 may operate to act as the second output unit 615-2 that outputs the second voltage signal V2 received from the first receiving converter 610 externally.

In a test of the second signal path, a circuit that includes the second transmitting converter 615, the second receiving converter 620, and/or the first transmitting converter 605 may be tested. Thus, the first switch SW1 may be connected to the second voltage-to-current converter 615-1 of the second transmitting converter 615. During the test of the second signal path, the third, fifth, seventh, and/or ninth switches SW3, SW5, SW7, and/or SW9 may be kept open to prevent the circuit in the first signal path from operating.

During the test of the second signal path, the eighth switch SW8, the sixth inverter IN6, and the third NMOS transistor N3, and the fourth current source 44 of the second transmitting converter 615 may operate to act as the second voltage-to-current converter 615-1 that converts the first test voltage signal V1 into the first current signal Idata.

During the test of the second signal path, the second receiving converter 620 may convert a voltage signal, induced at the second node NO2 by the difference between the first current signal Idata and the reference current signal Iref, into the CMOS-level voltage signal V2 and may output the second voltage signal V2.

As described above, during the test of the second signal path, the first transmitting converter 605 may act as the first output unit 605-2 that outputs the second voltage signal V2 received from the second receiving converter 620 externally. The fourth inverter IN4 may buffer the second voltage V2 received from the first receiving converter 610 or the second receiving converter 620, and may supply the buffered result to the core array 70.

Figure 4A:
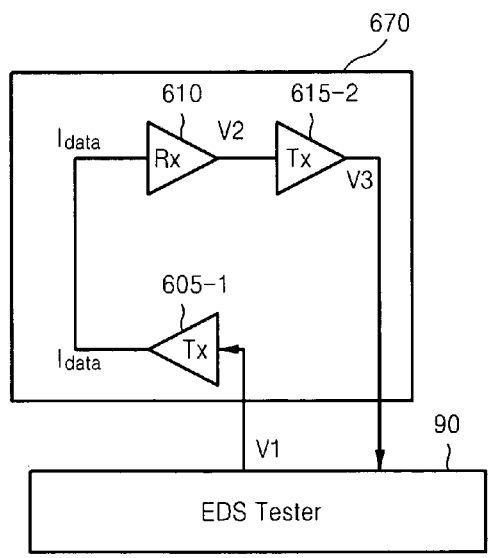
FIG. 4A is a schematic block diagram of an interface circuit of a semiconductor device according to example embodiments.
Figure 4B:
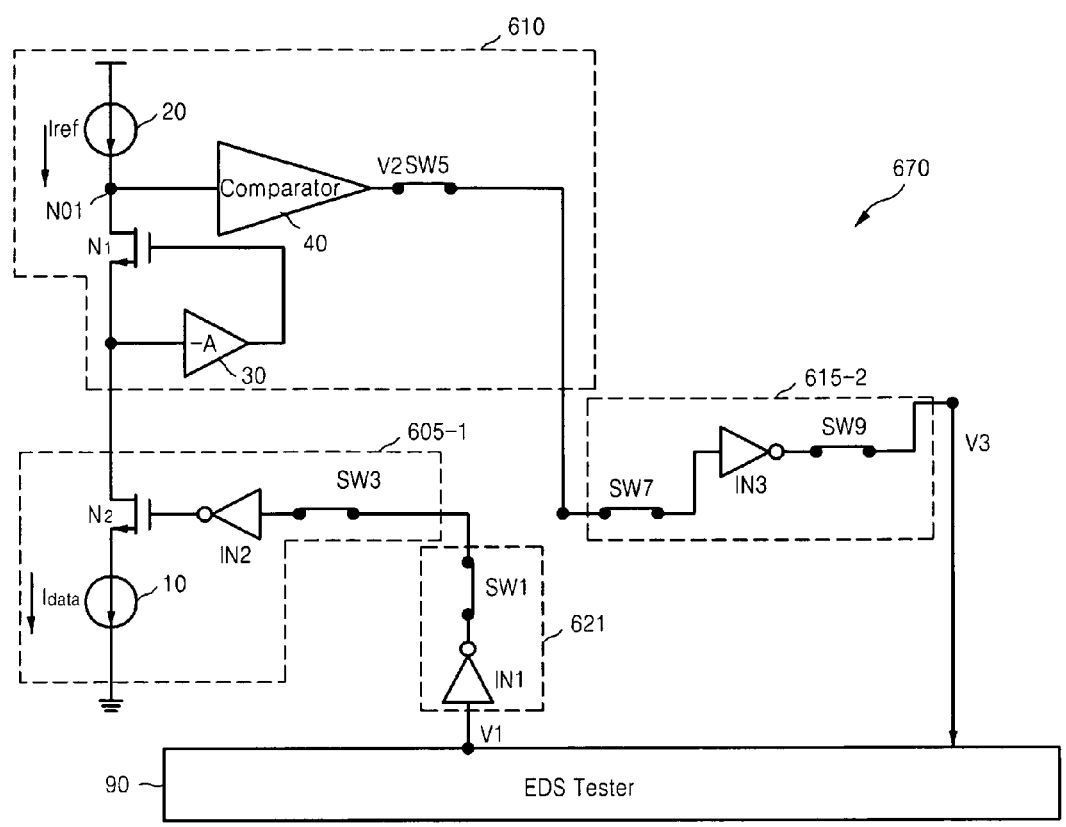
FIG. 4B is a detailed circuit diagram of the interface circuit illustrated in FIG. 4A according to example embodiments.

FIG. 4A is a schematic circuit diagram of an interface circuit 670 of a semiconductor device according to example embodiments. FIG. 4B is an example circuit diagram of the interface circuit 670 illustrated in FIG. 4A.

As compared to the interface circuit 600 illustrated in FIG. 2, the interface circuit 670 illustrated in FIG. 4A has a signal path fixed in one direction.

Referring to FIG. 4A, the interface circuit 670 may include the first voltage-to-current converter 605-1 of the first transmitting converter 605, the first receiving converter 610, and/or the second output unit 615-2 of the second transmitting converter 615 illustrated in FIG. 3. The first voltage-to-current converter 605-1 may receive a first test voltage signal V1 and may output first current signal Idata. The first receiving converter 610 may generate a reference current signal Iref, compare it with the first current Idata, and output a second voltage signal V2. The second output unit 615-2 may receive the second voltage signal V2 and output a third voltage signal V3. An EDS tester 90 may receive the first test voltage signal V1 and the third voltage signal V3 and perform the test. In example embodiments, the interface circuit 670 is illustrated and described with respect to the EDS tester 90, but another type of a tester operating in the voltage mode may also be used.

FIG. 4B is an example internal circuit diagram of the first voltage-to-current converter 605-1, the first receiving converter 610, the second output unit 615-2, and/or a selector 621 that may be included in the interface circuit 670 illustrated in FIG. 4A. Referring to FIG. 4B, the construction and operation of the interface circuit 670 will now be described in greater detail.

The first voltage-to-current converter 605-1 of the first transmitting converter 605 may include a third switch SW3, a second inverter IN2, a second NMOS transistor N2, and a first current source 10. The first receiving converter 610 may include a first negative feedback amplifier 30, a first NMOS transistor N1, a first comparator 40, a fifth switch SW5, a second current source 20, and/or a first node NO1. The second output unit 615-2 may include a seventh switch SW7, a third inverter IN3, and/or a ninth switch SW9.

The selector 621 may include a first inverter IN1 and a first switch SW1.

In example embodiments, the first switch SW1 of the selector 621 may be closed. The first inverter IN1 may be located between a test pin 1 and the first switch SW1, may invert the first test voltage signal V1, and may output the inverted result. The third switch SW3 of the first voltage-to-current converter 605-1 may be closed. The second inverter IN2 may be located between the third switch SW3 and a gate of the second NMOS transistor N2, may invert the signal from the first inverter IN1, and may output the inverted result. The second inverter IN2 may receive the first test voltage signal V1 and turn on the second NMOS transistor N2. Accordingly, when the first test voltage signal V1 is at a logic high level '1', the second NMOS transistor N2 may be turned on.

The second NMOS transistor N2 may be located between a source of the first NMOS transistor N1 and the first current source 10, and be turned on when the second inverter IN2 supplies the first test voltage signal V1 to the second NMOS transistor N2. The first current Idata may flow through the first NMOS transistor N1 at the same time when the second NMOS transistor N2 is turned on. The first current source 10 may be located between a source of the second NMOS transistor N2 and a ground voltage source, and may generate the first current Idata.

The first NMOS transistor N1 may be located between the first node NO1 and the second NMOS transistor N2, and may receive the first current Idata depending on whether the second NMOS transistor N2 operates. The first negative feedback amplifier 30 may be located between the gate and source of the first NMOS transistor N1 and reduces source resistance. The first comparator 40 may convert a voltage induced at the first node NO1 into the second voltage signal V2 having a CMOS level according to the difference between the first current signal Idata and the reference current signal Iref, and may output the second voltage signal V2. The second output unit 615-2 may receive the second voltage signal V2 and may output the third voltage V3. For example, the third inverter IN3 of the second output unit 615-2 may receive and invert the second voltage signal V2, and may output the third voltage V3 as the inverted result. In this case, the fifth and seventh switches SW5 and SW7 may be closed. The third voltage signal V3 may be supplied to the EDS tester 90 when the ninth switch SW9 is closed.

Although not shown in FIG. 4B, the signal (the second voltage signal V2) output from the first receiving converter 610 may be supplied to a core array (not sown) as illustrated in FIG. 3. Also, a signal output from the core array may be supplied to the EDS tester 90.

In example embodiments, the interface circuit 600 may be included in a column driver of an LCD, and the column driver may be tested with a voltage-mode tester, but example embodiments are not limited thereto. Example embodiments are applicable to not only an LCD, but also various types of semiconductor chips (any device under test).

As described above, according to example embodiments, an interface circuit capable of performing voltage-to-current conversion may be included in a chip, thereby allowing the chip operating in a current mode to be tested with an external tester operating in a voltage mode.

While example embodiments have been particularly shown and described, it will be understood by those skilled in the art that various changes in form and details may be made therein without departing from the spirit and scope of example embodiments as defined by the appended claims.

What is claimed is:

1. A semiconductor integrated circuit device, which operates in a current mode during a non-test mode and operates in a voltage mode during a test mode for testing of the semiconductor integrated circuit device, comprising:
   a first transmitting converter receiving a first test voltage signal and converting the first test voltage signal into a first test current signal during the test mode;
   a switch selectively supplying the first test voltage signal to the first transmitting converter based on the test mode;
   a first receiving converter receiving the first test current signal and a reference current signal, and generating a first output voltage signal based on the first test current signal and the reference current signal; and
   a first output unit outputting the first output voltage signal external to semiconductor integrated circuit device.

2. The semiconductor integrated circuit device of claim 1, further comprising a test voltage input terminal via which the first test voltage signal is received.

3. The semiconductor integrated circuit device of claim 2, further comprising a current signal input terminal,
   wherein, during the non-test mode, the first receiving converter generates the first output voltage signal, based on a data current signal received via the current signal input terminal and the reference current signal.

4. The semiconductor integrated circuit device of claim 3, wherein the first transmitting converter comprises a first transistor allowing the first test current to flow in response to the first test voltage signal, and
   the first receiving converter includes a comparator converting a voltage signal induced at a specific first node into the first output voltage signal having a CMOS voltage level, according to the difference between the first test current signal and the reference current signal or between the data current signal and the reference current signal.

5. The semiconductor integrated circuit device of claim 1, further comprising:
   a second transmitting converter receiving a second test voltage signal and converts the second test voltage signal into a second test current signal;
   a second receiving converter receiving the second test current signal and the reference current signal, and generating a second output voltage signal based on the second test current signal and the reference current signal; and
   a second output unit outputting the second output voltage signal external to the semiconductor integrated circuit device.

6. The semiconductor integrated circuit device of claim 5, wherein one of a first signal path and a second signal path selectively operates,
   wherein the first signal path includes the first transmitting converter, the first receiving converter, and the first output unit, and
   the second signal path includes the second transmitting converter, the second receiving converter, and the second output unit.

7. The semiconductor integrated circuit device of claim 6 further comprising:
   a selector selecting one of the first signal path and the second signal path.

8. A semiconductor integrated circuit device, which operates in a current mode during a non-test mode and operates in a voltage mode during a test mode for testing of the semiconductor integrated circuit device, comprising:
   a first transmitting converter receiving a first test voltage signal from a voltage-mode tester and converting the first test voltage signal into a first test current signal during the test mode;
   a switch selectively supplying the first test voltage signal to the first transmitting converter based on the test mode; and
   a first receiving converter converting the first test current signal into a first voltage signal during the test mode, and receiving a data current signal via a channel and converting the data current signal into the first voltage signal during the non-test mode.

9. The semiconductor integrated circuit device of claim 8, further comprising:
   a core array generating a core output signal based on the first voltage signal; and
   a first output unit outputting the core output signal external to semiconductor integrated circuit device.

10. The semiconductor integrated circuit device of claim 9, further comprising a second output unit outputting a voltage signal based on the first voltage signal during the test mode, and outputting a current signal based on the data current signal during the non-test mode.

11. The semiconductor integrated circuit device of claim 8, wherein the first receiving converter compares the first test current signal with a reference current signal and generates the first voltage signal during the test mode, and compares the data current signal with the reference current signal and generates the first voltage signal during the non-test mode.

12. A semiconductor integrated circuit device, which operates in a current mode during a non-test mode and operates in a voltage mode during a test mode for testing of the semiconductor integrated circuit device, comprising:
   a first transmitting converter receiving a first test voltage signal and converting the first test voltage signal into a first test current signal;
   a first receiving converter receiving the first test current signal and a reference current signal, and generating a first output voltage signal based on the first test current signal and the reference current signal; and
   a first output unit outputting the first output voltage signal external to semiconductor integrated circuit device,
   wherein the first transmitting converter comprises a first transistor allowing the first test current to flow in response to the first test voltage signal, and
   the first receiving converter includes a comparator converting a voltage signal induced at a specific first node into the first output voltage signal having a CMOS voltage level, according to the difference between the first test current signal and the reference current signal or between a data current signal and the reference current signal.

* * * * *